United States Patent [19]

Koprio

[11] Patent Number: 4,565,158

[45] Date of Patent: Jan. 21, 1986

[54] EVAPORATOR CELL FOR VACUUM DEPOSITION ON SUBSTRATES

[75] Inventor: Jürgen Koprio, Triesen, Liechtenstein

[73] Assignee: Balzers AG, Fed. Rep. of Germany

[21] Appl. No.: 635,906

[22] Filed: Jul. 30, 1984

[30] Foreign Application Priority Data

Sep. 5, 1983 [CH] Switzerland .................. 14848/83

[51] Int. Cl.$^4$ ............................................. C23C 3/12
[52] U.S. Cl. .................................. 118/726; 118/733; 219/275
[58] Field of Search ............... 118/726, 727, 715, 733; 219/271, 275; 156/611, 614, DIG. 103

[56] References Cited

U.S. PATENT DOCUMENTS 4,061,800 12/1977 Anderson .................. 118/726 X
4,401,052 8/1983 Boron et al. ................ 118/726 X

OTHER PUBLICATIONS

Budo et al., "Extended Virtual Evaporation Source and Deposition Device", *IBM Tech. Disclosure Bulletin*, vol. 19, No. 8, Jan. 1977, pp. 2826–2827.

*Primary Examiner*—Norman Morgenstern
*Assistant Examiner*—Bernard F. Plantz
*Attorney, Agent, or Firm*—McGlew and Tuttle

[57] ABSTRACT

An evaporator cell for vacuum deposition on substrates comprises a cell housing which has one end with a vapor escape opening and an opposite end into which is positionable a plug member which is moved in the housing so that its closed end be positioned in a position closing the vapor escape opening or away therefrom into various opening positions for regulating the amount of vapor which escapes during the vapor deposition. The plug is advantageously a closed tubular member which contains a heating element therein and is advantageously moved by means of a plunger which is mounted in a wall of the evaporator so as to be sealed.

8 Claims, 1 Drawing Figure

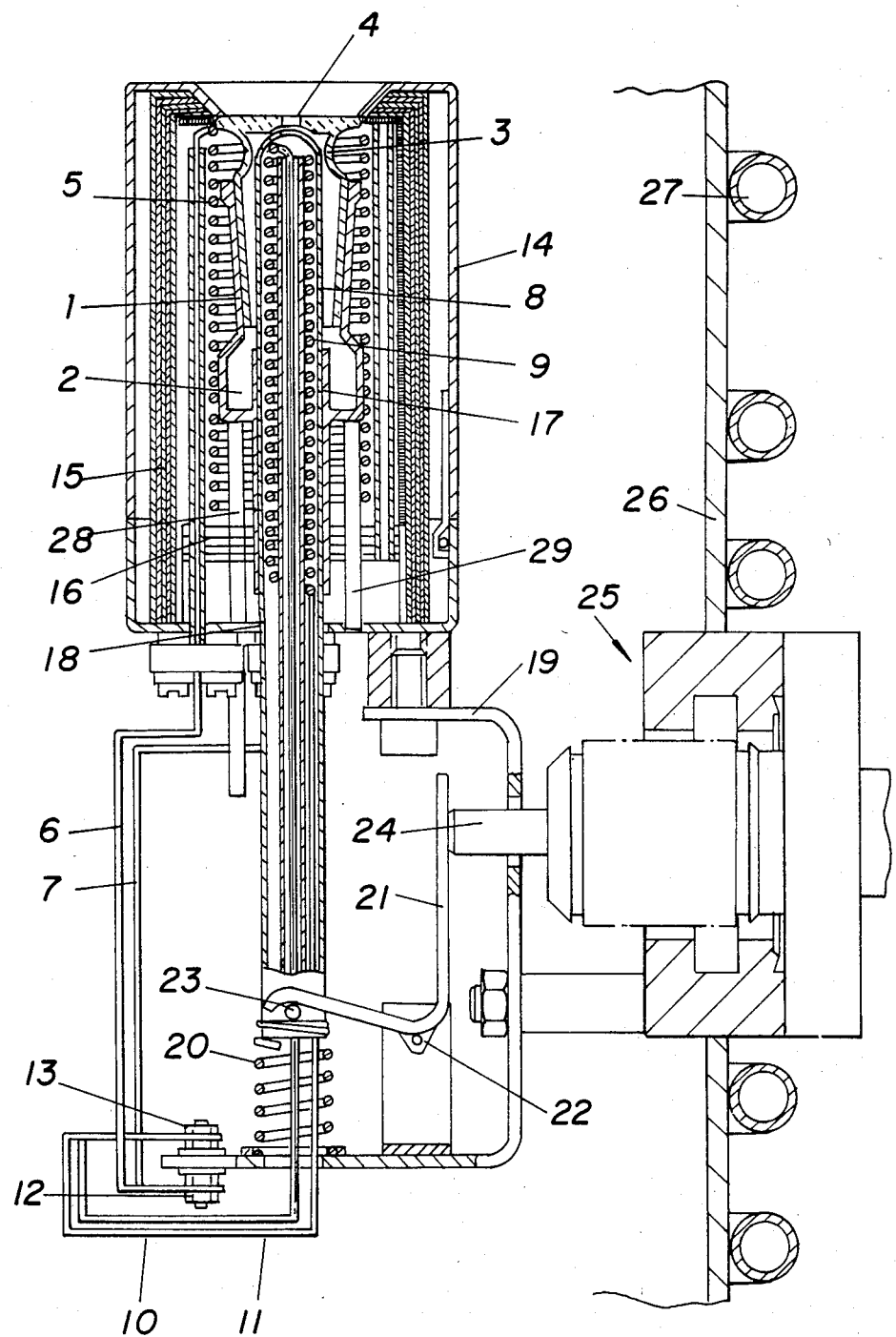

EVAPORATOR CELL FOR VACUUM DEPOSITION ON SUBSTRATES

FIELD AND BACKGROUND OF THE INVENTION

This invention relates in general to vacuum treating devices and in particular to a new and useful evaporator cell for applying thin layers on substrates by vacuum deposition.

By evaporator cell within the context of this specification, an evaporator in the form of a closed vessel is understood, from which the produced vapor escapes or is emitted through one or more apertures provided in the wall of the vessel.

Evaporative sources with movable screens are known thereabove, with which the escape way for the vapor stream can be opened or shut off. The vapor deposition time may thereby be adjusted to specific conditions, yet the rate of vapor emission from the source cannot be varied in this way.

Further known is an arrangement for controlling the rate of coating tapes by vapor deposition, providing adjustable screens between the evaporative source and the running tape, by means of which the tape portion to be exposed to the vapor stream is selected, then the time is defined during which each portion of the tape is coated. In this prior art arrangement again, not the vapor emission from the source but the deposition time for every portion of the tape is controlled.

To evaporate substances tending to sputter when fused, evaporators are sometimes employed in the art which are designed substantially as closed vessels having a wall portion with vapor escape openings (a screen). The wall prevents most of the spurting particles from reaching the substrates to be coated. To intercept even those which have passed through the screen into the deposition space, additional screens have been provided in front of the perforated wall portions, in staggered or offset position to prevent a straight-line passage of the substance to the substrates.

Also known are vapor sources or so called effusion cells, i.e. closed vessels in which the evaporative substance is heated, with the vapor escaping through an aperture provided in the wall of the vessel and having a diameter which is small relative to the mean free path of the vapor in the region of the outlet aperture.

Recently, more efficient evaporators have been developed for high evaporative rates, to improve the economy of coating. However, experience has shown that the high evaporative rates obtainable with such evaporators frequently cannot be utilized, because of their very high thermal intertia. For example, if layers of a mixture of different substances are deposited and the individual substances are evaporated in two or three separate evaporators, and if at the same time, the composition of the coating in the direction perpendicular to the substrate, is to be varied in accordance with a predetermined program, the problem arises that with too high evaporative rates, the mixing ratio cannot be varied quick enough. An adjustment of the evaporation, and the vapor deposition rate, which can be effected thermally by applying corresponding amounts of heat, leads to a time constant in the order of 10 to 60 seconds, which is too slow for economical manufacture. What is needed is rather to be able to adjust the evaporative rate to the specific coating requirements within substantially shorter time periods.

SUMMARY OF THE INVENTION

The invention is directed to an evaporator cell making possible a quick mechanical control of the vapor emission.

In accordance with the invention an evaporator cell for defining thin layers of evaporative material on substrates by vacuum deposition comprises a cell housing which has one end with a vapor escape aperture and an opposite end with a plug accommodating opening into which a plug member extends which has a closed inner end which is positionable alongside the vapor escape aperture and it is connected for movement to vary the position of the closed relative to the aperture for regulating the amount of vapor which is to escape. The plug member is a controlling mechanical element which is moved by a plunger which is mounted in a wall of an evaporator in a sealed manner.

An accommodation of the vapor escape controlling mechanical element in the interior of the cell has the great advantage that during the evaporation, the temperature of the element necessarily remains high enough to prevent vapor from condensing on the plug. This substantially reduces the risk that, due to a condensation on the plug, the vapor escape could no longer be controlled accurately, or that the movements of the mechanical element might even become blocked. In addition, the heat applied to the plug in the interior of the cell is to a large extent beneficial also the evaporative process.

In a particularly proved embodiment of the invention, the plug is designed as a hollow body and accommodates an electrical resistance heating element. With some evaporative materials, the heating of the plug may even be provided as the sole heating for the evaporative process. Conversely, the plug may be heated by the fused evaporative substance where a heating must be provided in any case, and a separate heating of the plug may be omitted. Anyway, it is easily obtained that the front portion of the plug which is in the zone of the vapor escape aperture, has the same, or even a higher temperature, depending on the construction, than needed for the evaporation, and this substantially increases the reliability in operation of the device as compared to any of the prior art constructions of the evaporator cell.

Accordingly, it is an object of the invention to have an evaporative cell which is usable in a vacuum deposition chamber for applying thin layers on substrates and which includes a crucible in which the evaporation is carried out which has a vapor escape opening at one end and an opposite end for accommodating a plug member which may be moved therein for regulating a position of the closed end of the plug relative to the vapor escape opening or regulating the vapor which escapes from the crucible.

A further object of the invention is to provide an evaporator cell which is adapted to be positioned inside of a vacuum chamber and which is operated by a plunger to effect positioning of a plug member in respect to the cell for varying the amount of vapor which escapes through a vapor escape opening of the cell.

A further object of the invention is to provide an evaporator cell which is simple in design, rugged in construction and economical to manufacture.

The various features of novelty which characterize the invention are pointed out with particularity in the claims annexed to and forming a part of this disclosure. For a better understanding of the invention, its operating advantages and specific objects attained by its uses, reference is made to the accompanying drawing and descriptive matter in which a preferred embodiment of the invention is illustrated.

BRIEF DESCRIPTION OF THE DRAWINGS

In the drawings:

The only FIGURE of the drawing is a partial sectional view of a vacuum chamber having an evaporator cell constructed in accordance with the invention.

DESCRIPTION OF THE PREFERRED EMBODIMENT

Referring to the drawings in particular the invention embodied therein comprises an evaporator cell in the form of a crucible 1 for applying thin layers of evaporator material which is indicated at 2 in the crucible 1 by vacuum deposition. The cell housing 1 has one end with a cover 3 having a vapor escape opening or aperture 4 and an opposite closed end with a sleeve 17 around a plug accommodating opening to which a plug member in the form of a hollow tube 8 extends. Cover 3 closes the crucible except for opening 4. The plug member 8 in accordance with the invention is moved relative to the vapor escape opening 4 so that a closed rounded end thereof may be varied in position in respect to a convex wall portion on the cover 3 adjacent escape opening 4 for the purpose of regulating the amount of vapor which escapes through the aperture. Cover 3 also has an upper concave surface which is over plug 8. In accordance with a feature of the invention, the movement of the plug 8 is effected by a return spring 20 in one direction, that is a direction toward the vapor escape opening 4, and in an opposite direction by a plunger 24 which is mounted in a vacuum seal 25 in a vacuum chamber wall 26. Plunger 24 mounted within a vacuum tight seal 25 acts on plug 8 over a lever 21 which is pivotally mounted at 22. Lever 21 acts on stud 23 which is fixed to plug 8.

In the shown embodiment the plug 8 can be lifted and lowered by actuating lever 21 through plunger 24, and adjusted in position such as to allow just the desired amount of vapor to pass through the aperture 4. While providing a vapor escape aperture having a diameter which is smaller than the mean free path of the vapor molecules at the temperature in the region of the aperture, the evaporator cell will operate as a so called Knudsen cell. Only the front side of the plug visible from the outside through the vapor escape aperture is effective as the evaporative area. In a Knudsen cell, this surface is very small, and for practical purposes, may be considered a point so that an extent cosine distribution of the vapor jet is obtained. If, on the contrary, the vapor escape aperture is enlarged by retracting the plug, a distribution can be obtained in which the directions of maximum vapor emission form a cone surface having an axis coinciding with the axis of plug 8. The minimum vapor emission then appears in the direction of this axis. Such a mode of operation may be advantageous, for example, in a vapor desposition apparatus, for placing substrates to be coated on a rotating spherical support (having its axis also coincident with the two mentioned axes), and locating another part of equipment, such as a pressure gauge, or a layer-thickness gauge, in the direction of the axis. Upon retracting the front of the plug from the vapor escape aperture to a distance corresponding to about twice the diameter of the aperture, the position of the plug no longer influences the vapor distribution and again a cosine distribution is obtained, now only with a substantially larger effective evaporative area.

Crucible 1 is held within a housing 14 by a plurality of ceramic tubes 28 and 29. Tube 28 may be used for introducing a thermocouple, if necessary. Housing 14 is held on a bracket 19 which is mounted on seal 25. Bracket 19 can also be used for mounting the pivot or fulcrum 22 for lever 21.

Plug 8 is movable in housing 14 through an aperture 18 at the bottom of the housing. An electrical heating coil 5 surrounds the crucible 1 and is connected to wire leads 6 and 7. A heating coil 9 is also provided in plug 8 and receives energy over leads 10 and 11. Leads 10 and 11 are connected to terminals 13 (only one of which is visible) and leads 6 and 7 are connected to terminals 12 (again only one being visible). Cylindrical protective screens 15 are provided in housing 14 for protection against radiation. These are of molybdenum or tantaloum, for example. Disc-shaped protective screens 16 are also provided within housing 14 substantially below crucible 1. Coolant lines 27 are also provided around vacuum chamber wall 26 for cooling wall 26.

It will be understood that the shown device may be modified in most various ways without departing from the scope of the invention. The plug does not necessarily extend through the evaporator cell axially, it may even be mounted laterally of the evaporator vessel and associated with a mechanism ensuring that the vapor escape aperture can be opened or closed to the desired extent.

Prior art evaporation sources for vacuum deposition apparatus in which the vapor emission is controlled through the temperature have very large time constants. The time constant can substantially be reduced by designing the evaporator cell as a closed vessel having a vapor escape aperture, and equipped inside with a displaceable plug for controlling the vapor emission.

While a specific embodiment of the invention has been shown and described in detail to illustrate the application of the principles of the invention, it will be understood that the invention may be embodied otherwise without departing from such principles.

What is claimed is:

1. An evaporator cell for applying a thin layer of evaporative material on a substrate by vacuum deposition, comprising a cell housing having one end with a vapor escape aperture and an opposite end with a plug accommodating opening, a plug extending in the opening and having a closed end which is positionable adjacent the vapor escape aperture, and means for moving said plug to vary the spacing between said closed end of said plug and said aperture for regulating the amount of vapor which is to escape, said closed end of said plug having a larger diameter than that of said aperture.

2. An evaporator cell according to claim 1, wherein said plug comprises a hollow body, and electrical resistance means for heating said body.

3. An evaporator cell according to claim 2, wherein said electrical resistance heating element is provided inside said hollow body.

4. An evaporator cell according to claim 1, wherein said housing and said plug are made of materials having similar thermal coefficients of expansion.

5. An evaporator cell according to claim 1, wherein said cell housing includes a crucible having a cover in which the vapor escape aperture is provided, said crucible including a bottom having a fitting sleeve defining an opening through which said plug is slidably engaged.

6. An evaporator cell according to claim 1, including a housing defining a vacuum chamber, a vacuum seal member mounted in a wall of said housing chamber, a mounting bracket carried by said seal member and supporting said cell housing, said means for moving said plug including a plunger carried by said mounting seal, a lever pitovally mounted on said bracket and having an arm engaged with said plunger and an opposite arm engaged with said plug, and including spring means biasing said plug member in a direction toward said vapor escape aperture, said plunger being actuable to move said lever and said plug in a direction away from the vapor escape aperture.

7. An evaporator cell according to claim 5, wherein said cover of said crucible has an inner concave wall portion which contains said vapor escape aperture, said closed end of said plug being convexly rounded for approaching said concave wall portion to reduce flow through said aperture.

8. An evaporator cell according to claim 1, wherein said cover has a convex wall portion adjacent said closed end of said plug for modifying flow vapor to said aperture.

* * * * *